(12) United States Patent
Li et al.

(10) Patent No.: US 9,905,177 B2
(45) Date of Patent: Feb. 27, 2018

(54) PIXEL STRUCTURE, ARRAY SUBSTRATE, DISPLAY PANEL AND DISPLAY DEVICE

(71) Applicant: BOE TECHNOLOGY GROUP CO., LTD., Beijing (CN)

(72) Inventors: Pan Li, Beijing (CN); Wenbo Li, Beijing (CN); Hongfei Cheng, Beijing (CN); Yong Qiao, Beijing (CN); Jianbo Xian, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 198 days.

(21) Appl. No.: 14/893,316

(22) PCT Filed: May 21, 2015

(86) PCT No.: PCT/CN2015/079474
§ 371 (c)(1),
(2) Date: Nov. 23, 2015

(87) PCT Pub. No.: WO2016/110039
PCT Pub. Date: Jul. 14, 2016

(65) Prior Publication Data
US 2016/0260399 A1 Sep. 8, 2016

(30) Foreign Application Priority Data

Jan. 8, 2015 (CN) .................. 2015 2 0012777 U

(51) Int. Cl.
*H01L 27/12* (2006.01)
*H01L 29/786* (2006.01)
(Continued)

(52) U.S. Cl.
CPC ......... *G09G 3/3648* (2013.01); *G02F 1/1368* (2013.01); *G02F 1/133707* (2013.01);
(Continued)

(58) Field of Classification Search
CPC ............. H01L 27/1214; H01L 27/3262; H01L 27/3248; H01L 27/3274; H01L 29/41733;
(Continued)

(56) References Cited

U.S. PATENT DOCUMENTS 8,259,245 B2 9/2012 Kim et al.
2004/0109099 A1* 6/2004 Lee .................. G02F 1/134363
349/38

(Continued)

FOREIGN PATENT DOCUMENTS

CN 144062824 A 9/2014
CN 204028530 U 12/2014
(Continued)

OTHER PUBLICATIONS

International Search Report dated Sep. 21, 2015.

*Primary Examiner* — Michael J Eurice
(74) *Attorney, Agent, or Firm* — Dilworth & Barrese, LLP.; Michael J. Musella, Esq.

(57) ABSTRACT

A pixel structure, an array substrate, a display panel and a display apparatus are disclosed. The pixel structure includes: a first pixel electrode and a second pixel electrode which are arranged along a first direction, and a TFT between the first pixel electrode and the second pixel electrode. The first pixel electrode includes a first extension electrode extending toward the second pixel electrode, and the second pixel electrode includes a second extension electrode extending toward the first pixel electrode; the TFT includes a gate electrode, a source electrode, a first drain electrode and a second drain electrode which are insulated from each other; the source electrode includes a first opening and a second opening, the first drain electrode is connected with the first extension electrode and extends into the first opening, and (Continued)

the second drain electrode is connected with the second extension electrode and extends into the second opening.

20 Claims, 5 Drawing Sheets

(51) Int. Cl.
H01L 29/417 (2006.01)
G09G 3/36 (2006.01)
G02F 1/1368 (2006.01)
H01L 29/49 (2006.01)
H01L 29/423 (2006.01)
H01L 27/32 (2006.01)
G02F 1/1362 (2006.01)
G02F 1/1337 (2006.01)
G02F 1/1343 (2006.01)

(52) U.S. Cl.
CPC .. *G02F 1/136227* (2013.01); *G02F 1/136286* (2013.01); *G02F 2001/134345* (2013.01); *G09G 3/3607* (2013.01); *G09G 2300/0426* (2013.01); *G09G 2300/0443* (2013.01); *G09G 2300/0447* (2013.01); *G09G 2300/0465* (2013.01); *H01L 27/1214* (2013.01); *H01L 27/3248* (2013.01); *H01L 27/3262* (2013.01); *H01L 27/3274* (2013.01); *H01L 29/41733* (2013.01); *H01L 29/42384* (2013.01); *H01L 29/4908* (2013.01)

(58) Field of Classification Search
CPC ........... H01L 29/42384; H01L 29/4908; G02F 1/133707; G02F 1/136227; G02F 1/136286; G02F 1/1368; G02F 2001/134345; G02F 2201/40; G09G 3/3607; G09G 3/3648; G09G 2300/0426; G09G 2300/0443; G09G 2300/0447; G09G 2300/0465
See application file for complete search history.

(56) References Cited

U.S. PATENT DOCUMENTS

| | | | | |
|---|---|---|---|---|
| 2005/0173707 A1* | 8/2005 | Shiraki | ............ | G02F 1/136259 257/72 |
| 2007/0131936 A1* | 6/2007 | Kang | ................. | G02F 1/1354 257/72 |
| 2007/0146566 A1* | 6/2007 | Hosoya | ............... | G02F 1/1362 349/43 |
| 2007/0159571 A1* | 7/2007 | Yang | ................. | G02F 1/136259 349/54 |
| 2007/0235733 A1* | 10/2007 | Moriya | ................. | H01L 51/055 257/57 |
| 2008/0088783 A1* | 4/2008 | Tai | ................... | G02F 1/136213 349/129 |
| 2008/0143912 A1* | 6/2008 | Kim | ................... | G02F 1/13624 349/48 |
| 2008/0158457 A1* | 7/2008 | Park | ................. | G02F 1/134363 349/39 |
| 2009/0096945 A1* | 4/2009 | Su | .................... | G02F 1/13454 349/38 |
| 2009/0195489 A1* | 8/2009 | Hung | ................. | G02F 1/136286 345/92 |
| 2010/0097555 A1* | 4/2010 | Huang | .............. | G02F 1/134309 349/139 |
| 2010/0123843 A1* | 5/2010 | Kim | ........................ | G03F 1/36 349/39 |
| 2011/0181805 A1* | 7/2011 | Nagami | ............ | G02F 1/134363 349/43 |
| 2012/0001189 A1* | 1/2012 | Matsubara | ........ | G02F 1/136286 257/59 |
| 2012/0037908 A1* | 2/2012 | Wu | ..................... | H01L 27/1214 257/59 |
| 2012/0105784 A1* | 5/2012 | Ho | .................... | G02F 1/136286 349/139 |
| 2012/0127067 A1* | 5/2012 | Tseng | ................ | G02F 1/134336 345/87 |
| 2012/0184060 A1* | 7/2012 | Song | ................... | H01L 27/1214 438/34 |
| 2012/0262430 A1* | 10/2012 | Ho | ...................... | G02F 1/13624 345/204 |
| 2013/0048999 A1* | 2/2013 | Okazaki | ............... | G02F 1/1368 257/59 |
| 2013/0120680 A1* | 5/2013 | Sun | ..................... | G02F 1/1368 349/43 |
| 2014/0070239 A1* | 3/2014 | Yang | ..................... | G02F 1/1362 257/88 |
| 2014/0084282 A1* | 3/2014 | Cao | ..................... | H01L 29/7869 257/43 |
| 2014/0091291 A1* | 4/2014 | Niu | ...................... | H01L 27/3276 257/40 |
| 2014/0103348 A1* | 4/2014 | Gai | ....................... | H01L 27/124 257/59 |
| 2014/0145199 A1* | 5/2014 | Shi | ..................... | H01L 29/4908 257/72 |
| 2014/0162415 A1* | 6/2014 | Huang | ............... | G02F 1/13338 438/158 |
| 2015/0028341 A1* | 1/2015 | Sun | ....................... | H01L 27/124 257/72 |
| 2015/0214286 A1* | 7/2015 | Niu | ..................... | H01L 27/3276 257/72 |
| 2015/0236043 A1* | 8/2015 | Shi | ...................... | H01L 27/1259 257/390 |
| 2015/0303222 A1* | 10/2015 | Ning | ..................... | G02F 1/1368 257/43 |
| 2015/0372016 A1* | 12/2015 | Cheng | ................... | H01L 27/124 257/72 |
| 2016/0020227 A1* | 1/2016 | Choi | ..................... | G02F 1/1362 257/43 |
| 2016/0111442 A1* | 4/2016 | Wu | ...................... | H01L 27/124 257/72 |
| 2016/0132162 A1* | 5/2016 | Sun | ......................... | G06F 3/044 257/72 |
| 2016/0246130 A1* | 8/2016 | Li | ........................ | G02F 1/13624 |
| 2016/0336351 A1* | 11/2016 | Li | ............................ | G02F 1/1368 |

FOREIGN PATENT DOCUMENTS

| | | |
|---|---|---|
| CN | 204065626 U | 12/2014 |
| CN | 204314580 U | 5/2015 |

* cited by examiner

PIXEL STRUCTURE, ARRAY SUBSTRATE, DISPLAY PANEL AND DISPLAY DEVICE

TECHNICAL FIELD

Embodiments of the present disclosure relate to a pixel structure, an array substrate, a display panel and a display apparatus.

BACKGROUND

Thin film transistor liquid crystal displays (TFT-LCD) have characteristics of thin thickness, low power consumption, no radiation and the like. The TFT-LCDs have been developed in a fast pace and occupied a leading position of a current panel display market. Now, the TFT-LCDs have been applied widely in various products having a large, middle or small size which cover almost main electronic products of a nowadays information society. Application of the TFT-LCDs in products having large sizes includes application in liquid crystal televisions and high definition digital televisions.

SUMMARY

A least one embodiment of the disclosure provides a pixel structure, an array substrate, a display panel and a display device, to resolve a problem that a pixel aperture ratio of a sub pixel unit is decreased, which is caused by increasing of an area of a TFT in the sub pixel unit for improving the driving ability of the TFT.

A least one embodiment of the disclosure provides a pixel structure, which includes: a first pixel electrode and a second pixel electrode which are arranged along a first direction, and a thin film transistor which is provided between the first pixel electrode and the second pixel electrode; the first pixel electrode comprises a first extension electrode extending toward the second pixel electrode, and the second pixel electrode comprises a second extension electrode extending toward the first pixel electrode; the thin film transistor comprises a gate electrode, a source electrode, a first drain electrode and a second drain electrode which are insulated from each other; the source electrode comprises a first opening and a second opening, the first drain electrode is electrically connected with the first extension electrode and extends into the first opening, and the second drain electrode is electrically connected with the second extension electrode and extends into the second opening.

A least one embodiment of the disclosure provides an array substrate comprising a sub pixel unit array formed on a substrate. Each sub pixel unit comprises the pixel structure provided by the above mentioned embodiment.

A least one embodiment of the disclosure provides a display panel, comprising the array substrate provided by the above mentioned embodiment.

A least one embodiment of the disclosure provides a display device, comprising the display panel provided by the above mentioned embodiment.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

During research, it is noted by the inventors of the application that, for a liquid crystal television, a TFT on an array substrate having stronger driving ability is needed, because each sub pixel unit in the liquid crystal television has a relatively large area. Currently, an area of the TFT is often increased for improving the driving ability of the TFT, but the TFT having a larger area occupies a display region of the sub pixel unit, which causes a pixel aperture ratio of the sub pixel unit to be decreased.

Figure 1:
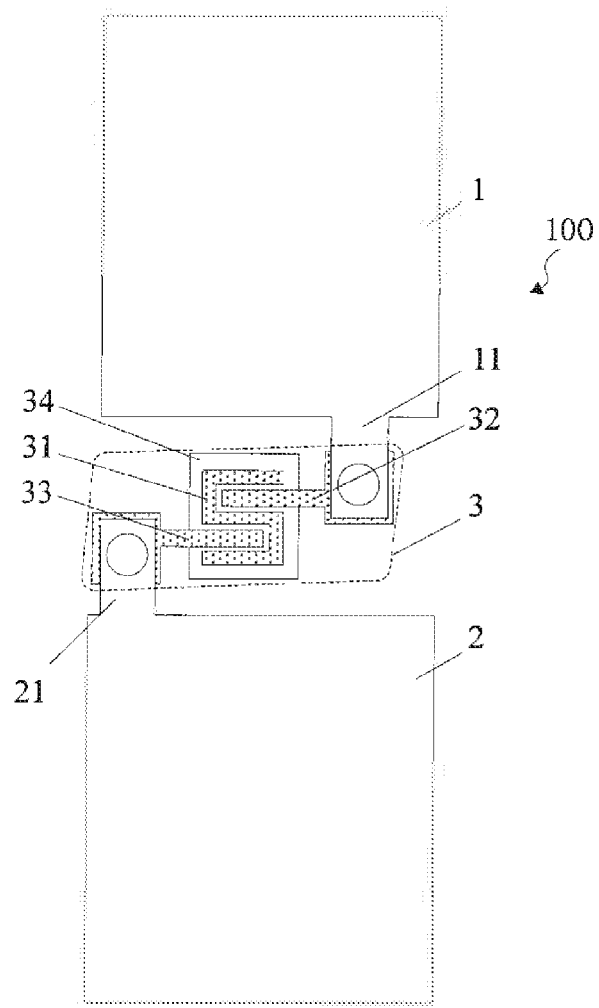
FIG. 1 is a schematic diagram of a first type of a pixel structure according to an embodiment of the disclosure.
Figure 2:
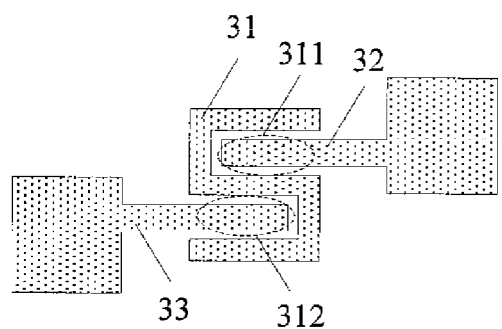
FIG. 2 is an enlarged schematic diagram of a source electrode, a first drain electrode and a second drain electrode shown in FIG. 1.
Figure 3:
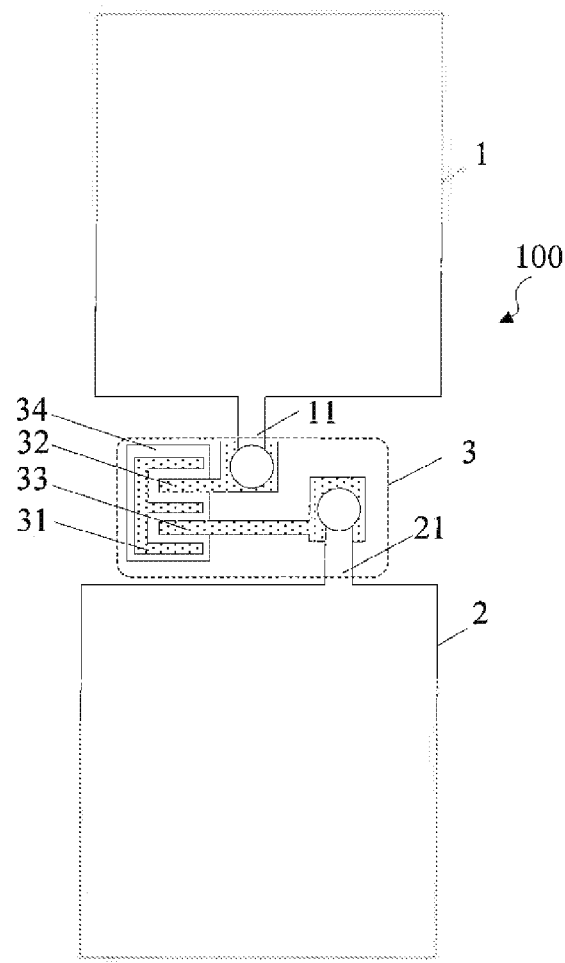
FIG. 3 is a schematic diagram of a second type of a pixel structure according to an embodiment of the disclosure.
Figure 4:
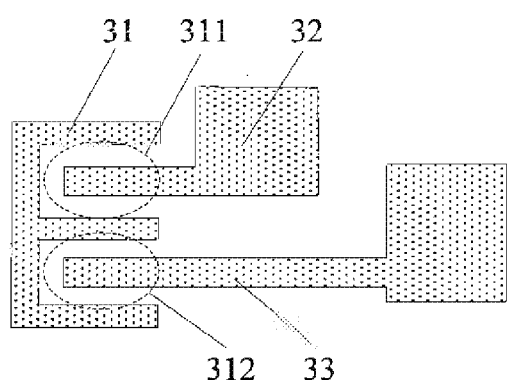
FIG. 4 is an enlarged schematic diagram of a source electrode, a first drain electrode and a second drain electrode shown in FIG. 3.

Referring to FIG. 1 to FIG. 4, a pixel structure 100 provided by an embodiment of the application includes a first pixel electrode 1 and a second pixel electrode 2 which are arranged along a first direction (for example, a longitudinal direction shown in FIGS. 1 and 3), and a thin film transistor (referred to as TFT) which is provided between the first pixel electrode 1 and the second pixel electrode 2. The first pixel electrode 1 includes a first extension electrode 11 extending toward the second pixel electrode 2, and the second pixel electrode 2 includes a second extension electrode 21 extending toward the first pixel electrode 1. The TFT 3 includes a gate electrode 34, a source electrode 31, a first drain electrode 32 and a second drain electrode 33 which are insulated from each other. As shown in FIG. 2 and FIG. 4, the source electrode 31 includes a first opening 311 and a second opening 312. The first drain electrode 32 is electrically connected with the first extension electrode 11 and extends into the first opening 311, and the second drain electrode 33 is electrically connected with the second extension electrode 21 and extends into the second opening 312.

In the TFT 3, the gate electrode 34 can be provided above or below the source electrode 31. In addition, the TFT 3 can further include an active layer (not shown in figures) provided between the gate electrode 34 and the source electrode 31.

For example, the first direction can be a column direction or a row direction of a sub pixel unit array, or an inclined direction (for example, a diagonal direction along the first pixel electrode or the second pixel electrode).

In the embodiments of the disclosure, the source electrode 31 includes a first opening 311 and a second opening 312. A width to length ratio of a channel region formed by the first drain electrode 32 and the second drain electrode 33 is increased, so that the driving ability of the TFT 3 can be improved. The first pixel electrode 1 and the second pixel electrode 2 have extension electrodes which extend toward each other, respectively. The first drain electrode 32 and the second drain electrode 33 are electrically connected to the corresponding extension electrodes, respectively. Thus, a region between the first pixel electrode 1 and the second pixel electrode 2 is used effectively, so that the display region of the sub pixel unit will not be occupied by the first drain electrode 32 and the second drain electrode 33, thereby achieving that a pixel aperture ratio of the sub pixel unit is improved while the driving ability of the TFT is improved.

Various kinds of specific pixel structures 100 can be obtained according to different kinds of shapes and different positions of the source electrode 31, the first drain electrode 32 and the second drain electrode 33. Examples are illustrated as follows.

Figure 5:
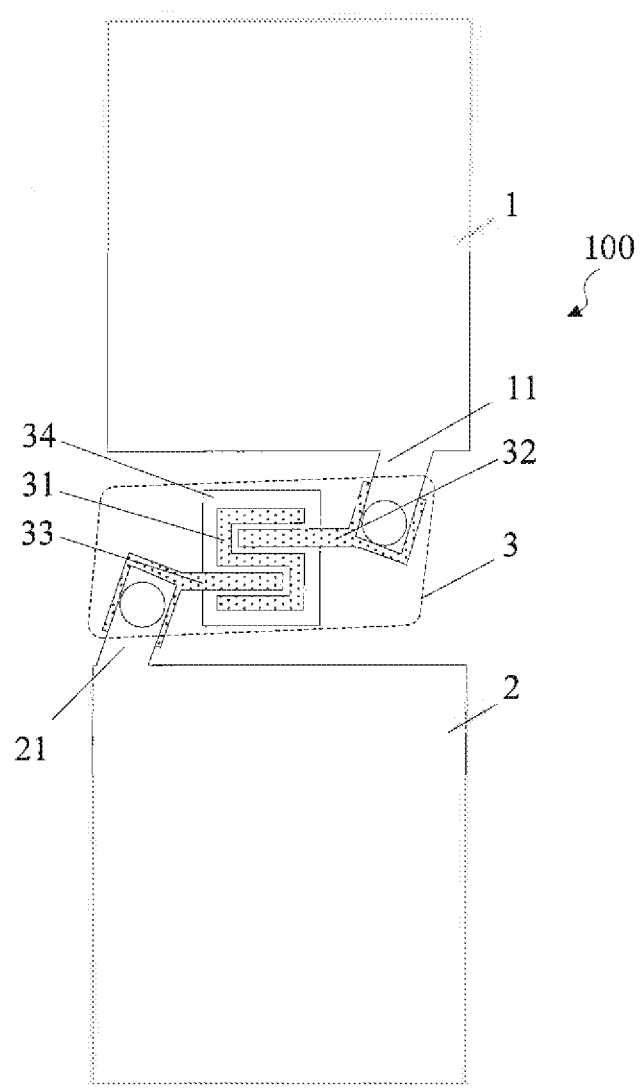
FIG. 5 is a schematic diagram of a third type of a pixel structure according to an embodiment of the disclosure.

For example, with respect to the pixel structure 100 shown in FIG. 1, an enlarged schematic view of the source electrode 31, the first drain electrode 32 and the second drain electrode 33 of the pixel structure 100 is shown in FIG. 2. In FIG. 2, the source electrode 31 is in an S shape. Orientations of the first opening 311 and the second opening 312 are opposite to each other. The first drain electrode 32 and the second drain electrode 33 are located at different sides of the source electrode 31. Of course, the first extension electrode 11 of the first pixel electrode 1 and the second extension electrode 21 of the second pixel electrode 2 can be modified, and in combination with the pixel structure 100 in FIG. 1, the pixel structure 100 shown in FIG. 5 can be obtained (similar numerical references have similar meanings in FIGS. 1 and 5).

For example, with respect to the pixel structure 100 shown in FIG. 3, an enlarged schematic view of the source electrode 31, the first drain electrode 32 and the second drain electrode 33 of the pixel structure 100 is shown in FIG. 4. In FIG. 4, the source electrode 31 is in an M shape (FIG. 4 shows the M-shaped source electrode 31 after being rotated counterclockwise by 90°). Orientations of the first opening 311 and the second opening 312 are the same. The first drain electrode 32 and the second drain electrode 33 are located at a same side of the source electrode 31.

Opening directions of the first opening 311 and the second opening 312 can be selected flexibly, so that conditions of orientations, shapes and the like of the first drain electrode 32 and the second drain electrode 33 are accommodated. For example, opening directions of the first opening 311 and the second opening 312 are perpendicular to the first direction, in order to simplify designs.

In at least one embodiment of the disclosure, vertical projections of the first extension electrode 11, the second extension electrode 21 and the gate electrode 34 (for example, orthogonal projections projected along a direction perpendicular to a surface at which the first pixel electrode or the second pixel electrode is located) have no overlapped regions. In this way, parasitic capacitance may not be produced between the gate electrode 34 and the first extension electrode 11 as well as the second extension electrode 21, when the pixel structure provided by embodiments of the disclosure is applied on an array substrate.

For example, the first drain electrode 32 and the first extension electrode 11 can be electrically connected by a via hole, and the second drain electrode 33 and the second extension electrode 21 can be electrically connected by another via hole Beneficial effects of the embodiment of the disclosure include the following: the first pixel electrode and the second pixel electrode have extension electrodes which extend to each other respectively, the first drain electrode and the second drain electrode are electrically connected with the corresponding extension electrodes respectively, and the first drain electrode and the second drain electrode can extend into corresponding openings along a horizontal direction from respective connections between respective drain electrodes and respective extension electrodes, which causes the TFT to have a larger area, i.e., the driving ability of the TFT is improved; the region between the first pixel electrode and the second pixel electrode can be effectively used by the above mentioned designs, so that the display region of the sub pixel unit will not be occupied by the first drain electrode and the second drain electrode, thereby improving a pixel aperture ratio of the sub pixel unit while the driving ability of the TFT is improved.

Figure 6:
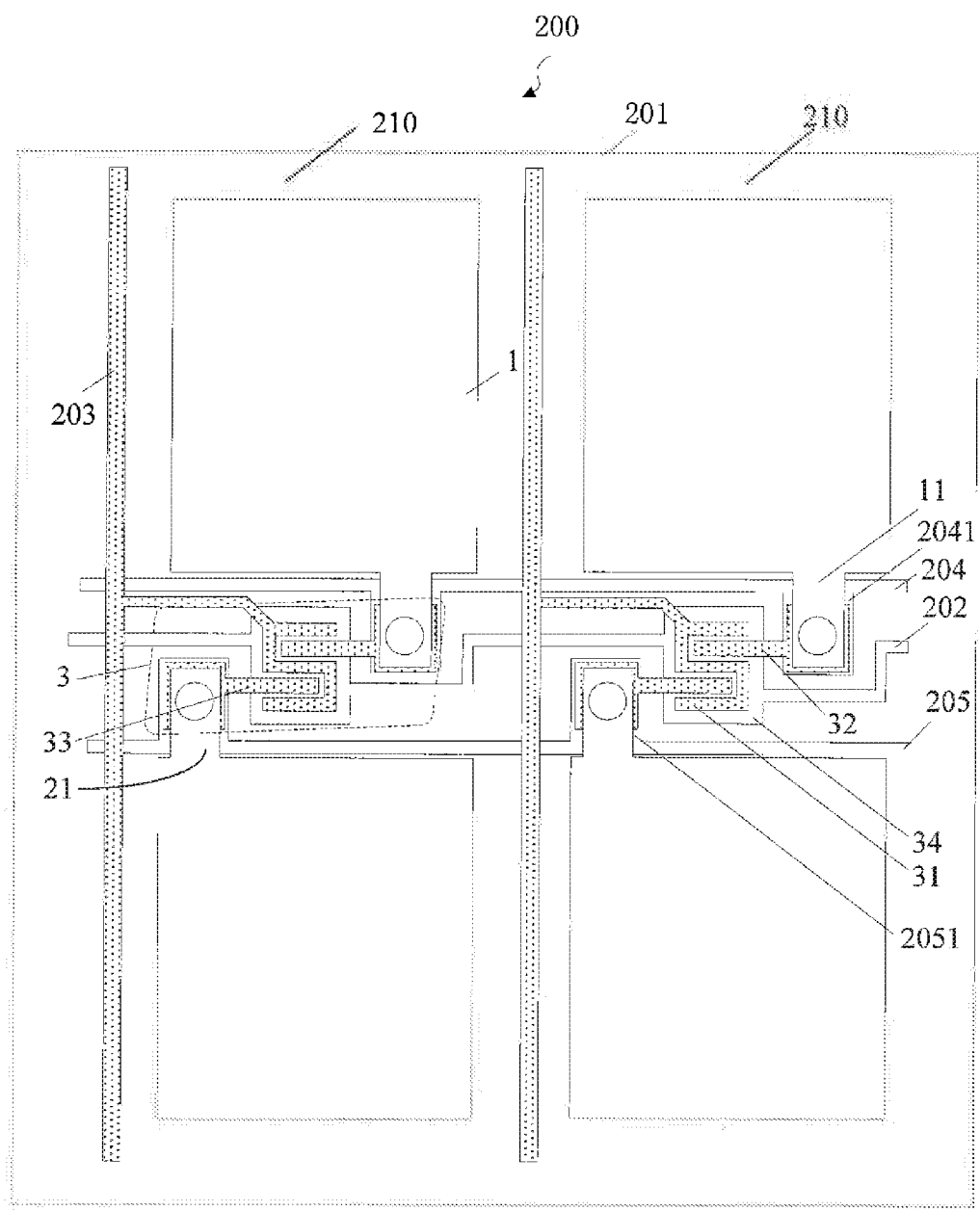
FIG. 6 is a partial schematic diagram of a first type of an array substrate according to an embodiment of the disclosure.
Figure 7:
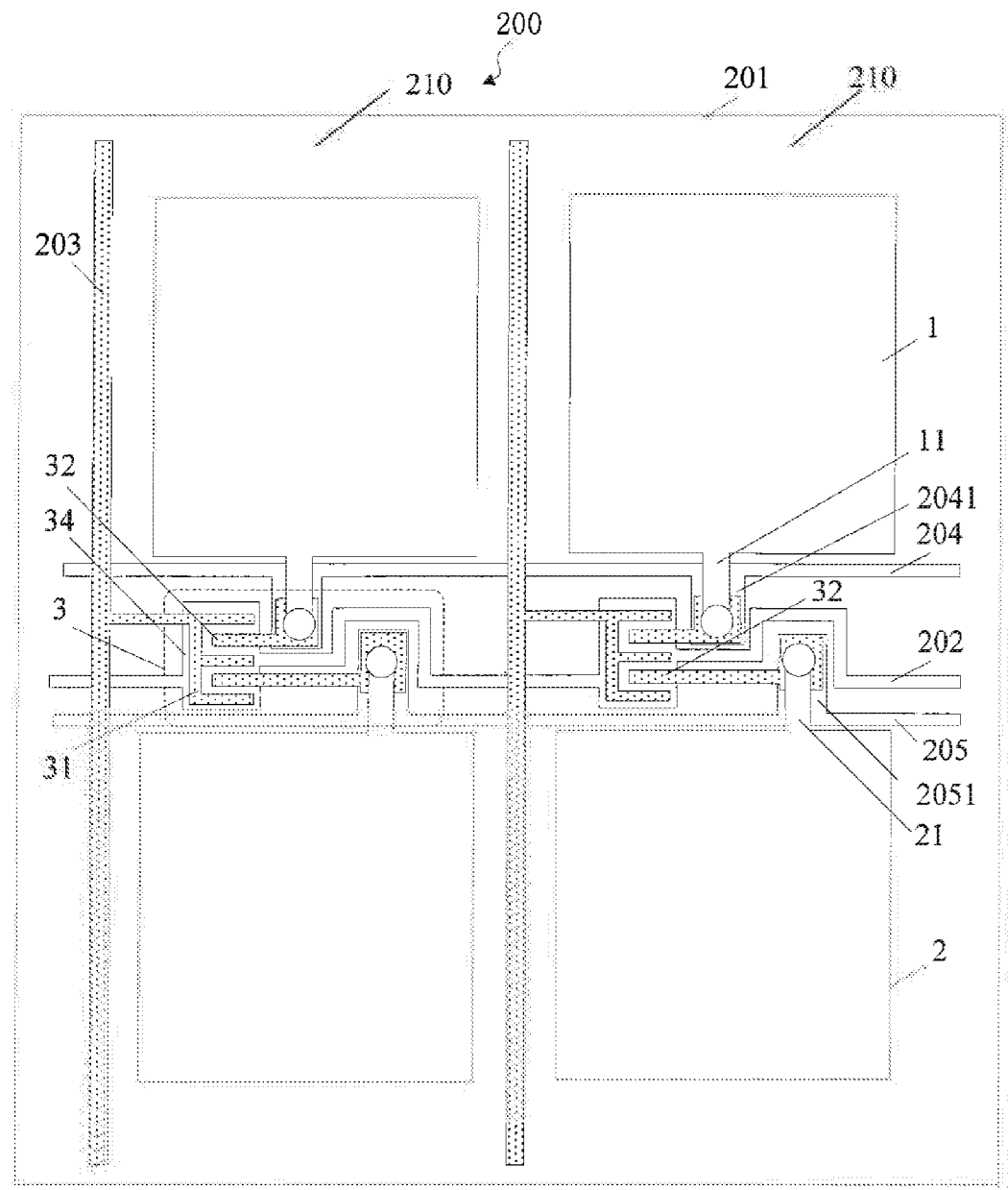
FIG. 7 is a partial schematic diagram of a second type of an array substrate according to an embodiment of the disclosure.

Referring to FIG. 6 and FIG. 7, at least one embodiment of the disclosure provides an array substrate 200, which includes a sub pixel unit array formed on a substrate 201. The sub pixel unit 210 has the pixel structure 100 provided by any of the above mentioned embodiments.

For example, a gate line 202 having a zigzag line shape is provided between the first pixel electrode 1 and the second pixel electrode 2 of each sub pixel unit which belongs to a same row. The gate line 202 is connected with all gate electrodes 34 of the sub pixel units in the same row. A data line 203 is provided between two adjacent columns of sub pixel units. It should be noted that the data line 203 which is provided in this embodiment is only for illustration purpose, and the embodiments of the disclosure are not limited to this kind of configuration.

For example, vertical projections of the first drain electrode 32, the second drain electrode 33, the first extension electrode 11 and the second extension electrode 21 on the substrate 201 are not overlapped with a vertical projection of the gate line 202 on the substrate 201.

For example, a first common electrode line 204 and a second common electrode line 205 are provided between the first pixel electrode 1 and the second pixel electrode 2 of each sub pixel unit which belongs to a same row. The first common electrode line 204 is close to the first pixel electrode 1. The first common electrode line 204 and the second common electrode line 205 respectively include extension parts which are extended toward each other, such as an extension part 2041 of the first common electrode line 204 and an extension part 2051 of the second common electrode line 205. A vertical projection of the extension part 2041 of the first common electrode line 204 on the substrate 201 and the vertical projection of the first extension electrode 11 on the substrate 201 are partially overlapped or completely overlapped, and a vertical projection of the extension part 2051 of the second common electrode line 205 on the substrate 201 and the vertical projection of the second extension electrode 21 on the substrate 201 are partially overlapped or completely overlapped.

For example, a vertical projection of the first common electrode line 204 on the substrate 201 and vertical projections of the gate line 202 and the gate electrode 34 on the substrate 201 are not overlapped, and a vertical projection of the second common electrode line 205 on the substrate 201 and the vertical projections of the gate line 202 and the gate electrode 34 on the substrate 201 are not overlapped.

It should be noted that the pixel structure provided by the embodiments of the disclosure includes two sub pixel electrodes (for example, the first pixel electrode 1 and the second pixel electrode 2). This pixel structure can also be modified, so that it can include three, four or more sub pixel electrodes. Of course, the pixel structure including a plurality of sub pixel electrodes should meet the following conditions: a plurality of drain electrodes of the pixel structure including the plurality of sub pixel electrodes are electrically connected to extension electrodes of the plurality of sub pixel electrodes respectively, the source electrodes are designed based on connection locations between respective drain electrodes and respective extension electrodes, and the connection locations between respective drain electrodes and respective extension electrodes are not overlapped with the vertical projection of the gate line. Similar description will not be repeated here.

In addition, in the embodiments of the disclosure, a vertical projection is an orthogonal projection along a direction perpendicular to the substrate 201.

Beneficial effects of the embodiments of the disclosure include the following: the first pixel electrode and the second pixel electrode have extension electrodes which extend toward each other respectively, the first drain electrode and the second drain electrode are electrically connected with the corresponding extension electrodes respectively; the source electrode includes the first opening and the second opening, the first drain electrode and the second drain electrode can extend into corresponding openings along a horizontal direction from respective connections between respective drain electrodes and respective extension electrodes, which causes the TFT to have a larger area, i.e., the driving ability of the TFT is improved; the region between the first pixel electrode and the second pixel electrode can be effectively used by the above mentioned designs, so that the display region of the sub pixel unit will not be occupied by the first drain electrode and the second drain electrode, thereby improving a pixel aperture ratio of the sub pixel unit while the driving ability of the TFT is improved.

An embodiment of the disclosure provides a display panel, which includes the array substrate provided by the above mentioned embodiment. For example, the display panel is a liquid display panel or an OLED (Organic Light-Emitting Diode) display panel, etc.

Beneficial effects of the embodiment of the disclosure include the following: the first pixel electrode and the second pixel electrode have extension electrodes which extend toward each other respectively, the first drain electrode and the second drain electrode are electrically connected with the corresponding extension electrodes respectively; the source electrode includes the first opening and the second opening, and the first drain electrode and the second drain electrode can extend into corresponding openings along a horizontal direction from respective connections between respective drain electrodes and respective extension electrodes, which causes the TFT to have a larger area, i.e., the driving ability of the TFT is improved; the region between the first pixel electrode and the second pixel electrode can be effectively used by the above mentioned designs, so that the display region of the sub pixel unit will not be occupied by the first drain electrode and the second drain electrode, thereby improving a pixel aperture ratio of the sub pixel unit while the driving ability of the TFT is improved.

An embodiment of the disclosure provides a display device, which includes the display panel provided by the above mentioned embodiment. The display device can be a liquid crystal display device, an OLED display device, an electronic paper, a cell phone, a panel computer, a television set, a display, a laptop computer, a digital photo frame, a navigation equipment and any product or component which has a display function.

Beneficial effects of the embodiment of the disclosure include the following: the first pixel electrode and the second pixel electrode have extension electrodes which extend toward each other respectively, the first drain electrode and the second drain electrode are electrically connected with the corresponding extension electrodes respectively; the source electrode includes the first opening and the second opening, and the first drain electrode and the second drain electrode can extend into corresponding openings along a horizontal direction from respective connections between respective drain electrodes and respective extension electrodes, which causes the TFT to have a larger area, i.e., the driving ability of the TFT is improved; the region between the first pixel electrode and the second pixel electrode can be effectively used by the above mentioned designs, so that the display region of the sub pixel unit will not be occupied by the first drain electrode and the second drain electrode, thereby improving a pixel aperture ratio of the sub pixel unit while the driving ability of the TFT is improved.

The above embodiments of the disclosure are merely illustrative, and not used to limit the protection scope of the disclosure. The protection scope of the disclosure is determined by appended claims.

This application claims the priority of Chinese Patent Application No. 201520012777.X filed on Jan. 8, 2015, which is incorporated entirely herein by reference as a part of this application.

The invention claimed is:

1. A pixel structure, comprising: a first pixel electrode and a second pixel electrode which are arranged along a first direction, and a thin film transistor which is provided between the first pixel electrode and the second pixel electrode, wherein:
   the first pixel electrode comprises a first extension electrode extending toward the second pixel electrode, and the second pixel electrode comprises a second extension electrode extending toward the first pixel electrode;
   the thin film transistor comprises a gate electrode, a source electrode, a first drain electrode and a second drain electrode which are insulated from each other; the source electrode comprises a structure that has a first opening and a second opening, the first drain electrode is electrically connected with the first extension electrode and extends into the first opening, and the second drain electrode is electrically connected with the second extension electrode and extends into the second opening;
   the first extension electrode directly contacts with a main body of the first pixel electrode, extends outward from the main body of the first pixel electrode and is connected to the first drain electrode through a first contact hole; and
   the second extension electrode directly contacts with a main body of the second pixel electrode, extends outward from the main body of the second pixel electrode and is connected to the second drain electrode through a second contact hole.

2. The pixel structure of claim 1, wherein vertical projections of the first extension electrode, the second extension electrode and the gate electrode are non-overlapped.

3. The pixel structure of claim 1, wherein opening directions of the first opening and the second opening are perpendicular to the first direction.

4. The pixel structure of claim 3, wherein vertical projections of the first extension electrode, the second extension electrode and the gate electrode have no overlapped regions.

5. The pixel structure of claim 1, wherein the source electrode is in an S shape, orientations of the first opening and the second opening are opposite to each other, and the first drain electrode and the second drain electrode are located at different sides of the source electrode.

6. The pixel structure of claim 5, wherein opening directions of the first opening and the second opening are perpendicular to the first direction.

7. The pixel structure of claim 5, wherein vertical projections of the first extension electrode, the second extension electrode and the gate electrode have no overlapped regions.

8. The pixel structure of claim 1, wherein the source electrode is in an M shape, orientations of the first opening and the second opening are identical, and the first drain electrode and the second drain electrode are located at a same side of the source electrode.

9. The pixel structure of claim 8, wherein opening directions of the first opening and the second opening are perpendicular to the first direction.

10. The pixel structure of claim 8, wherein vertical projections of the first extension electrode, the second extension electrode and the gate electrode have no overlapped regions.

11. An array substrate, comprising a sub pixel unit array formed on a substrate, wherein each sub pixel unit in the sub pixel unit array comprises the pixel structure of claim 1.

12. The array substrate of claim 11, wherein a first common electrode line and a second common electrode line are provided between the first pixel electrodes and the second pixel electrodes of the sub pixel units in the same row, the first common electrode line is close to the first pixel electrodes, the first common electrode line and the second common electrode line respectively comprise extension parts which are extended toward each other, a vertical projection of the extension part of the first common electrode line on the substrate and a vertical projection of the first extension electrode on the substrate are partially overlapped or completely overlapped, and a vertical projection of the extension part of the second common electrode line on the substrate and a vertical projection of the second extension electrode on the substrate are partially overlapped or completely overlapped.

13. The array substrate of claim 12, wherein a vertical projection of the first common electrode line on the substrate and vertical projections of the gate line and the gate electrode on the substrate are not overlapped, and a vertical projection of the second common electrode line on the substrate and the vertical projections of the gate line and the gate electrode on the substrate are not overlapped.

14. A display panel, comprising the array substrate of claim 11.

15. A display device, comprising the display panel of claim 14.

16. The array substrate of claim 11, wherein a gate line having a zigzag line shape is provided between first pixel electrodes and second pixel electrodes of sub pixel units in a same row; the gate line is connected to all gate electrodes of the sub pixel units in the same row; and vertical projections of first drain electrodes, second drain electrodes, first extension electrodes and second extension electrodes on the substrate have no overlapped regions with a vertical projection of the gate line on the substrate.

17. The array substrate of claim 16, wherein a first common electrode line and a second common electrode line are provided between the first pixel electrodes and the second pixel electrodes of the sub pixel units in the same row, the first common electrode line is close to the first pixel electrodes, the first common electrode line and the second common electrode line respectively comprise extension parts which are extended toward each other, a vertical projection of the extension part of the first common electrode line on the substrate and a vertical projection of the first extension electrode on the substrate are partially overlapped or completely overlapped, and a vertical projection of the extension part of the second common electrode line on the substrate and a vertical projection of the second extension electrode on the substrate are partially overlapped or completely overlapped.

18. The array substrate of claim 17, wherein a vertical projection of the first common electrode line on the substrate and vertical projections of the gate line and the gate electrode on the substrate are not overlapped, and a vertical projection of the second common electrode line on the substrate and the vertical projections of the gate line and the gate electrode on the substrate are not overlapped.

19. An array substrate, comprising a sub pixel unit array formed on a substrate, wherein each sub pixel unit in the sub pixel unit array comprises the pixel structure of claim 5.

20. An array substrate, comprising a sub pixel unit array formed on a substrate, wherein each sub pixel unit in the sub pixel unit array comprises the pixel structure of claim 8.

* * * * *